(12) United States Patent
Inokuma

(10) Patent No.: US 9,219,071 B1
(45) Date of Patent: Dec. 22, 2015

(54) SEMICONDUCTOR DEVICE

(71) Applicant: KABUSHIKI KAISHA TOSHIBA, Tokyo (JP)

(72) Inventor: Hideki Inokuma, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/636,730

(22) Filed: Mar. 3, 2015

Related U.S. Application Data

(60) Provisional application No. 62/011,637, filed on Jun. 13, 2014.

(51) Int. Cl.
*H01L 27/088* (2006.01)
*H01L 27/115* (2006.01)
*H01L 23/528* (2006.01)
*H01L 23/532* (2006.01)

(52) U.S. Cl.
CPC .......... *H01L 27/1157* (2013.01); *H01L 23/528* (2013.01); *H01L 23/5329* (2013.01); *H01L 23/53266* (2013.01); *H01L 27/11524* (2013.01)

(58) Field of Classification Search
CPC ..................... H01L 27/11582; H01L 29/7926; H01L 2924/0002; H01L 27/1157; H01L 27/11556; H01L 27/11578; H01L 29/66833; H01L 2924/00; H01L 27/11551; H01L 27/11575; H01L 27/0688; H01L 27/2454; H01L 27/11565
USPC .................. 257/314–315, 324, 499, E29.309, 257/E29.001; 438/259, 270, 666, 703
See application file for complete search history.

(56) References Cited

FOREIGN PATENT DOCUMENTS

| JP | H02241032 | 9/1990 |
|---|---|---|
| JP | 2011204985 | 10/2011 |
| JP | 2012060035 | 3/2012 |

*Primary Examiner* — Mark A Laurenzi
(74) *Attorney, Agent, or Firm* — Patterson & Sheridan, LLP

(57) ABSTRACT

A semiconductor device includes a substrate, a plurality of element regions that are partitioned in a line-and-space shape and extend in a first direction in the substrate, a plurality of selection gates that are formed on the substrate to extend in a second direction intersecting the first direction. In addition, the semiconductor device includes a contact region that includes a plurality of contact plugs which are provided between two selection gates adjacent to each other and are connected to the respective element regions in the substrate. Further, the contact plug includes an upper portion and a lower portion. The upper portion has a first width and is formed of a first conductive film and a second conductive film. The lower portion has a second width smaller than the first width and is formed of the first conductive film.

20 Claims, 16 Drawing Sheets

SEMICONDUCTOR DEVICE

CROSS-REFERENCE TO RELATED APPLICATION

This application is based upon and claims the benefit of priority from U.S. Provisional Patent Application No. 62/011,637, filed Jun. 13, 2014, the entire contents of which are incorporated herein by reference.

FIELD

Embodiments described herein relate to a semiconductor device.

BACKGROUND

In semiconductor devices, a contact having a small dimension is formed on a conductive region, and adjacent contacts are separated from one another at a small pitch (small spacing). However, the deterioration of a breakdown voltage between conductive regions adjacent to each other and a contact opening can easily occur.

DETAILED DESCRIPTION

Figure 1:
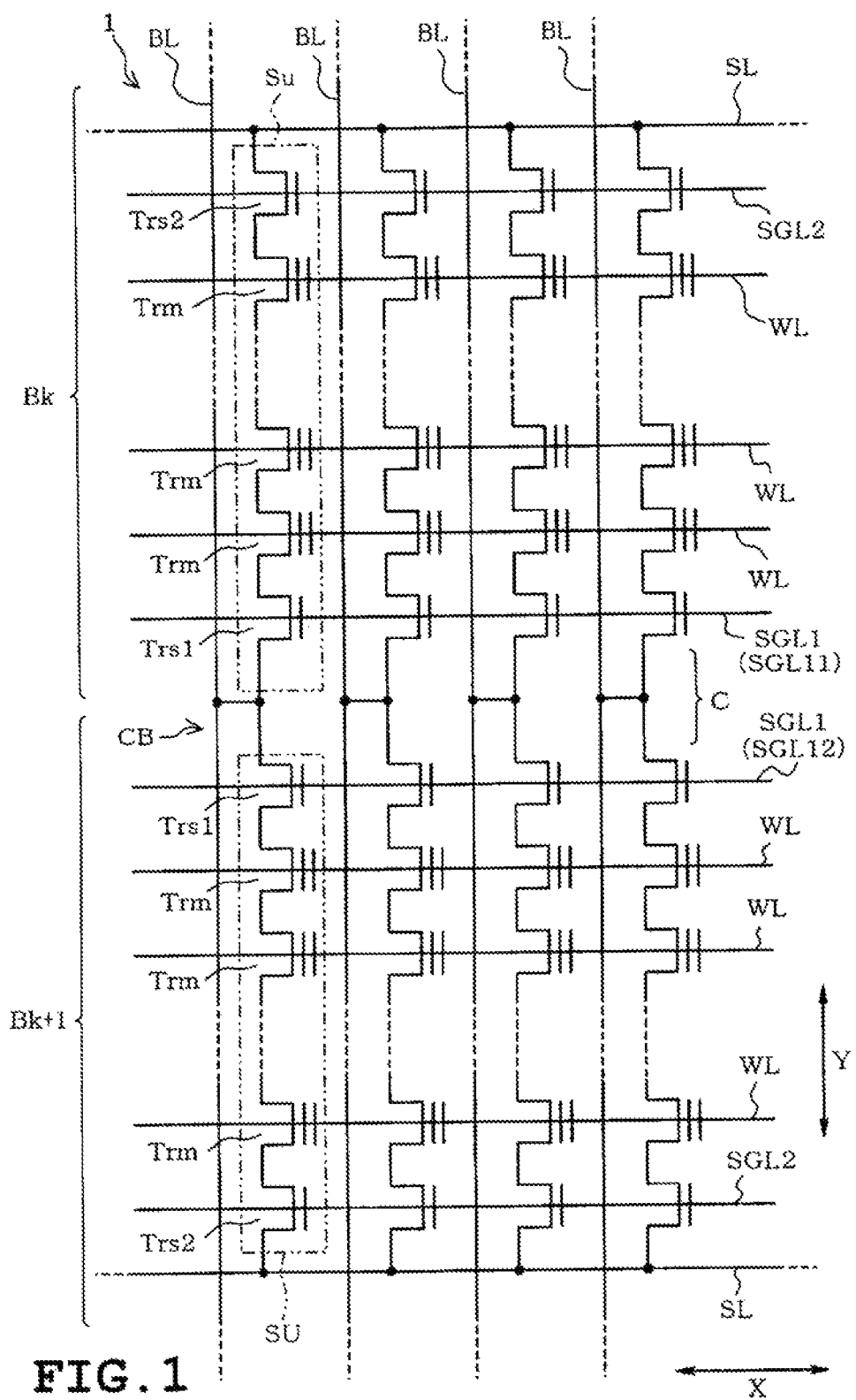
FIG. 1 is an example of an equivalent circuit diagram showing a portion of a memory cell array of a NAND-type flash memory device according to an embodiment.

A semiconductor device according to this embodiment includes: a substrate; a plurality of element regions that are positioned in a line-and-space shape and extend in a first direction in the substrate; and a plurality of selection gates that are formed on the substrate to extend in a second direction intersecting the first direction. In addition, the semiconductor device includes a contact region that includes a plurality of contact plugs which are provided between two selection gates adjacent to each other and connected to the respective element regions in the substrate. Further, the contact plug includes an upper portion and a lower portion. The upper portion has a first width and comprises a stacked film including a first conductive film and a second conductive film. The lower portion has a second width smaller than the first width and comprises the first conductive film.

First Embodiment

Hereinafter, a first embodiment in which a NAND-type flash memory device is applied as an example of a semiconductor device will be described with reference to FIGS. 1 to 12. In the following description, components having substantially the same function and configuration will be denoted by the same reference numerals and signs, and a description thereof will be appropriately omitted here. The drawings are schematic, and a relationship between a thickness and a planar size, a thickness ratio of each layer, and the like do not necessarily coincide with those of an actual device. In addition, terms indicating directions such as up and down in the description indicate relative directions when an element formation surface side of a semiconductor substrate to be described later is the upper side, and the directions may be different from real directions based on a gravitational acceleration direction.

Meanwhile, in the following description, an XYZ orthogonal coordinate system is used for convenience of description. In the coordinate system, two directions which are parallel to the surface of a semiconductor substrate and perpendicular to each other are assumed to be an X direction and a Y direction, a direction in which word lines WL extend is assumed to be the X direction, and a direction which is perpendicular to the X direction and in which bit lines BL extend is assumed to be the Y direction. A direction perpendicular to both the X direction and the Y direction is assumed to be a Z direction.

First, the configuration of a NAND-type flash memory device 1 according to this embodiment will be described. FIG. 1 is an example of an equivalent circuit diagram showing a portion of a memory cell array formed in a memory cell region of the NAND-type flash memory device 1 according to the embodiment.

As shown in FIG. 1, the NAND-type flash memory device 1 includes a memory cell array in which a large number of memory cells are disposed in a matrix. The NAND-type flash memory device 1 includes two selection gate transistors Trs1 and Trs2 within the memory cell array. The NAND-type flash memory device 1 is configured such that NAND cell units SU, each include a plurality of (for example, 32, 64, and 128) memory cell transistors Trm connected in series between selection gate transistors Trs1 and Trs2, are formed in a matrix. In addition, the NAND-type flash memory device 1 includes a dummy memory cell (not shown) within the NAND cell unit SU when necessary. The memory cell transistors adjacent to each other in the plurality of memory cell transistors Trm share a source and drain region within the NAND cell unit SU.

In FIG. 1, the memory cell transistors Trm disposed in the X-direction (word line direction) are connected in common to a word line WL. In FIG. 1, the selection gate transistors Trs1 disposed in the X-direction are connected in common to a selection gate line SGL1, and the selection gate transistors Trs2 are connected in common to a selection gate line SGL2.

A bit line contact CB (CBa and CBb in FIGS. 2 and 3) is connected to the drain region of the selection gate transistor Trs1. In FIG. 1, the bit line contacts CB extend in the Y-direction (bit line direction) and are connected to a plurality of bit lines BL, respectively, which are disposed in parallel in the X-direction. In addition, the selection gate transistor Trs2 is connected to a source line SL extending in the X-direction in FIG. 1 through a source region.

Figure 2:
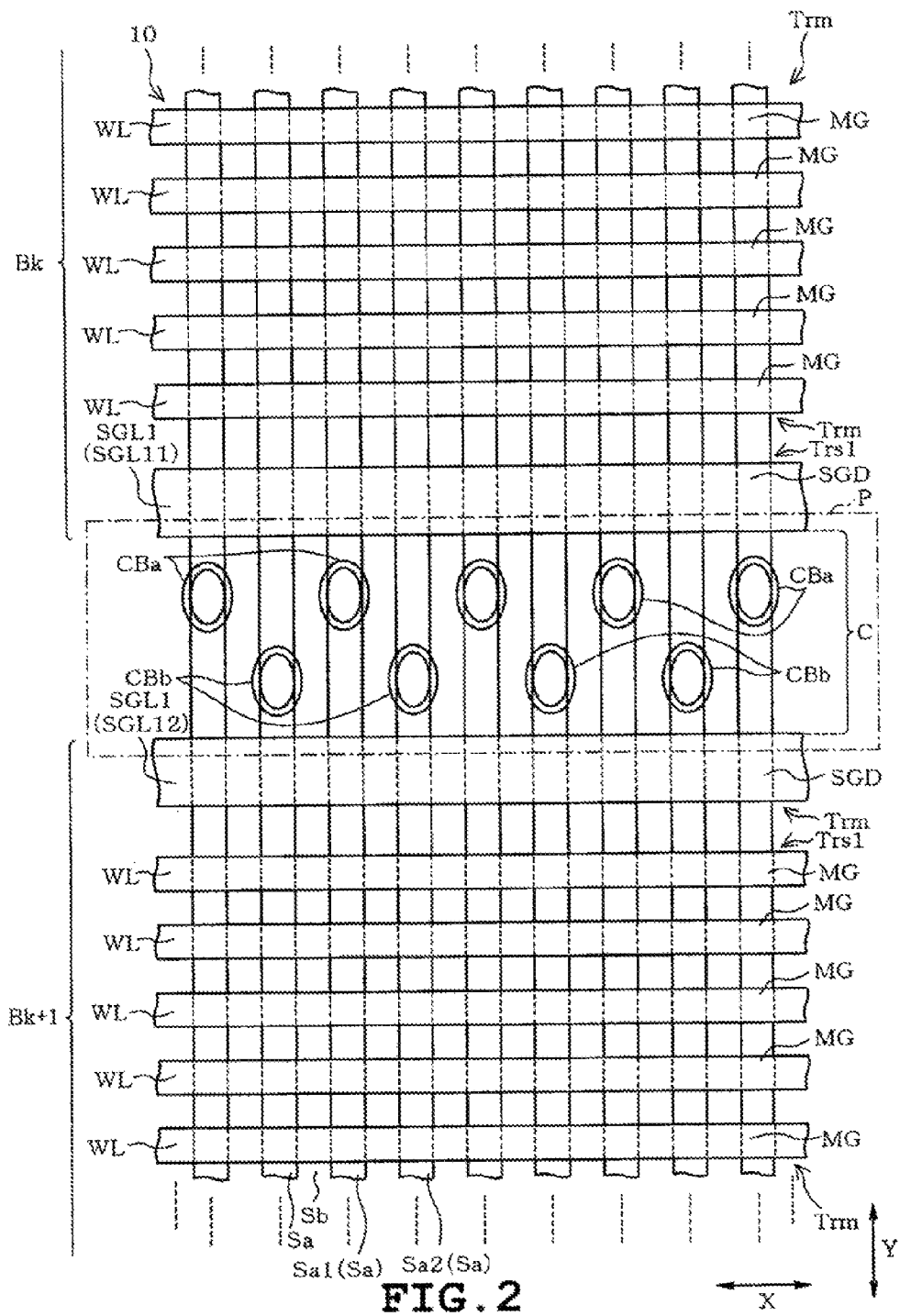
FIG. 2 is an example of a plan view showing a layout pattern of a portion of a memory cell region.
Figure 3:
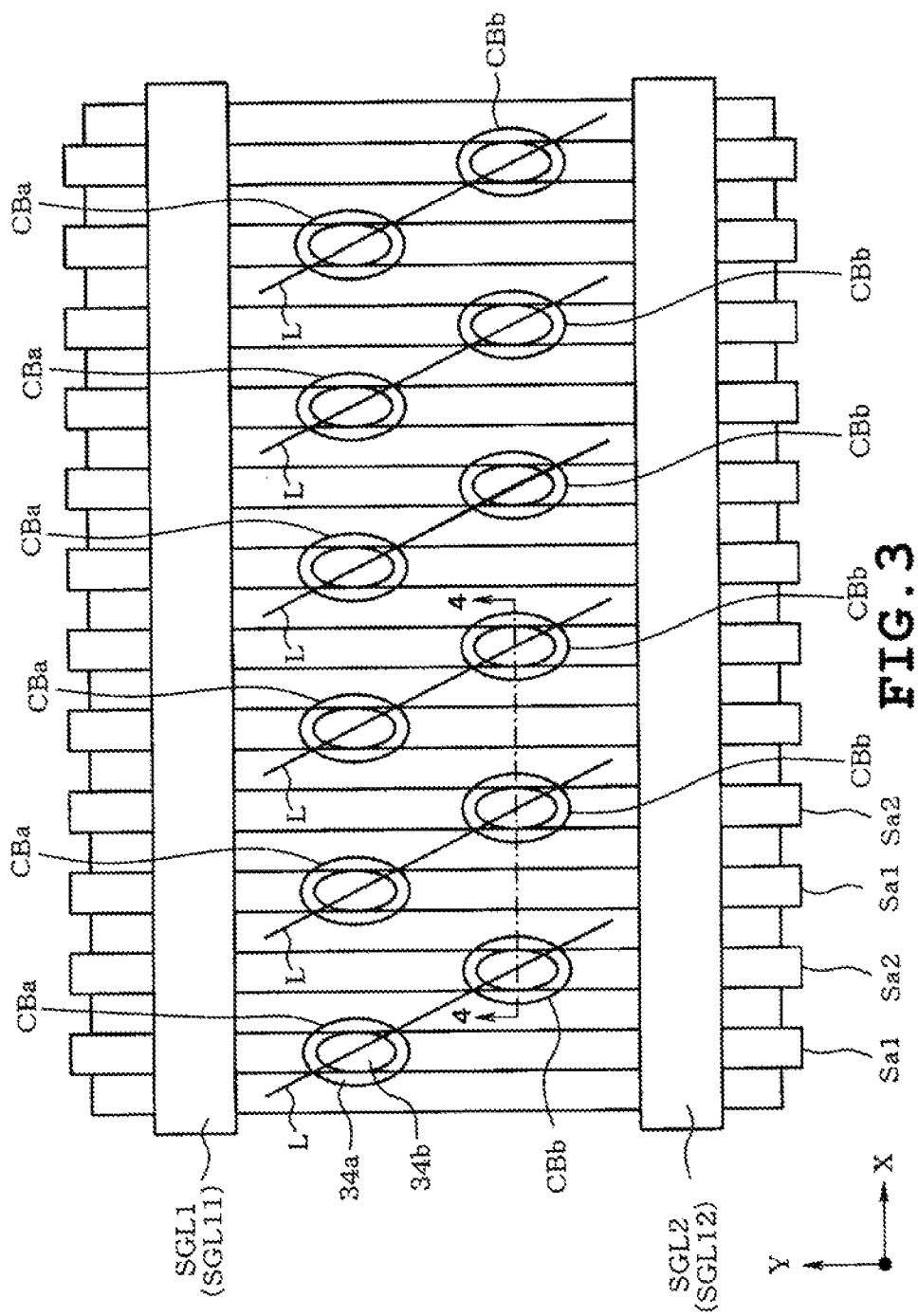
FIG. 3 is an example of an enlarged plan view showing a bit line contact region in FIG. 2 and selection gate electrodes adjacent to the bit line contact region.

FIG. 2 is an example of a plan view showing a layout pattern of a portion of the memory cell region. FIG. 3 is an example of an enlarged plan view of a bit line contact region C and the selection gate line SGL1 adjacent to the region C in FIG. 2. As shown in FIGS. 2 and 3, an element isolation area Sb, having shallow trench isolation (STI) structure extending inwardly of the semiconductor substrate 10 is formed to extend along the Y-direction in the drawing. A plurality of element isolation areas Sb are formed at predetermined x-direction intervals of the drawing. Thus, element regions Sa are formed between adjacent element isolation region Sb and likewise extend along the Y-direction of the drawing, and the plurality of element regions Sa are spaced apart in the X-direction so as to be separated from one another. That is, the plurality of element regions Sa are disposed in a line-and-space configuration and they extend in the Y-direction. The element regions Sa are spaced in the X-direction at a minimum pitch and have a minimum dimension.

The word line WL is formed extend along a direction (X-direction in the drawing) perpendicular to and crossing the element region Sa. The plurality of word lines WL each extend in the X-direction and are and spaced apart at predetermined intervals in the Y-direction in the drawing. A memory cell gate electrode MG of a memory cell transistor Trm is formed on the element region Sa crossing the word line WL.

As shown in FIG. 1, the plurality of memory cell transistors Trm which are connected to each other in series so as to be adjacent to each other in the Y-direction serve as a portion of a NAND string (memory cell string). The selection gate transistors Trs1 and Trs2 are provided at opposed ends of the plurality of memory cell transistors Trm, and thus at opposite ends of the NAND string.

The plurality of selection gate transistors Trs1 are spaced apart in the X-direction, and selection gate electrodes SGD (see FIG. 2) of the plurality of selection gate transistors Trs1 are electrically connected together by a selection gate line SGL1. The selection gate electrode SGD of the memory cell transistor Trs1 is configured on the element region Sa where it is crossed by the selection gate line SGL1.

In addition, as shown in FIG. 1, the plurality of selection gate transistors Trs2 are spaced apart in the X-direction, and selection gate electrodes (not shown in FIG. 2) of the plurality of selection gate transistors Trs2 are electrically interconnected by a selection gate line SGL2. The selection gate electrode (not shown) is also configured on the element region Sa where it is crossed by the selection gate line SGL2.

As shown in FIG. 1, the bit line contact region C (see FIGS. 1 and 2) is provided between the selection gate transistors Trs1 of adjacent, in the Y-direction, NAND cell units SU-SU. The plurality of bit line contacts CB (CBa and CBb) are formed in the bit line contact region C.

Each of the plurality of bit line contacts CBa and CBb is formed on one of the plurality of element regions Sa extending across a bit line contact region C. Each of the bit line contacts CB is formed on the element region Sa between adjacent selection gate transistors Trs1-Trs1 on opposite sides of a bit line contact region C.

As shown in FIGS. 2 and 3, the bit line contacts CBa formed on odd-numbered first element regions Sa1 (Sa), spaced the X-direction when seen in a plan view (when seen in a top view), are configured such that the position thereof in the Y-direction is proximate to a selection gate line SGL11 (selection gate electrode SGD) side of a block Bk. In addition, the bit line contacts CBb formed on even-numbered second element regions Sa2 (Sa) in the X-direction are configured such that the position thereof in the Y-direction is proximate to a selection gate line SGL12 (selection gate electrode SGD) side of a block Bk+1. The element regions Sa1 and Sa2 are alternately disposed along the X-direction. As described above, since the element regions Sa are disposed as lines between spaces forming element isolation regions so as to have a minimum pitch therebetween and thus a minimum spacing dimension therebetween in the X-direction, a distance in the X-direction between the bit line contacts CB adjacent to each other has a minimum dimension.

On the other hand, adjacent pairs of bit line contacts CBa and CBb are oriented along a line L in a direction parallel to the semiconductor substrate 10 and which is not parallel to the X-direction and the Y-direction. Two of the bit line contacts CBa and CBb successively formed adjacent to each other are disposed on the element regions Sa1 and Sa2 successively formed adjacent to each other so as to be mounted on the straight line L. The two adjacent bit line contacts CBa and CBb are set as one unit, and this unit is repeatedly disposed in the X-direction. That is, the bit line contacts CBa and CBb are disposed so as to have a so-called two-adjacent staggered disposition.

As described above, in the third embodiment, the bit line contacts CBa and CBb are disposed in a zigzag shape (a so-called two-adjacent staggered disposition in which two-successive contacts are set as a repetition unit of a zigzag structure) in which the positions of the bit line contacts are sequentially shifted in the Y-direction on two directly adjacent element regions Sa (Sa1 and Sa2). Accordingly, a distance in the Y-direction between the adjacent bit line contacts CB (between CBa and CBb) is greater than the spacing between adjacent element formation regions, and thus it is possible to increase the distance between the adjacent bit line contacts CB. Although not shown in the drawing, a source line contact is formed on the element region Sa between the pair of selection gate lines SGL2 and SGL2.

As described above, this embodiment is applied to a case where the bit line contact CB is formed on the element region Sa which is formed to have a minimum dimension in the X-direction.

As shown in FIG. 3, the bit line contacts CB have an elliptical shape having a major axis in the Y-direction and a minor axis in the X-direction when seen in a plan view. In addition, the bit line contact CB includes a first portion 34a having a large diameter and a second portion 34b having a small diameter when seen in a plan view. As will be described later, the bit line contact CB (first contact plug 34 to be described later) includes the second portion 34b having a small diameter on the lower portion thereof which comes into contact with the semiconductor substrate 10, and the first portion 34a having a large diameter on the upper portion thereof, spaced from the semiconductor substrate 10.

This is a basic configuration of the NAND-type flash memory device 1 to which this embodiment is applied.

Figure 4:
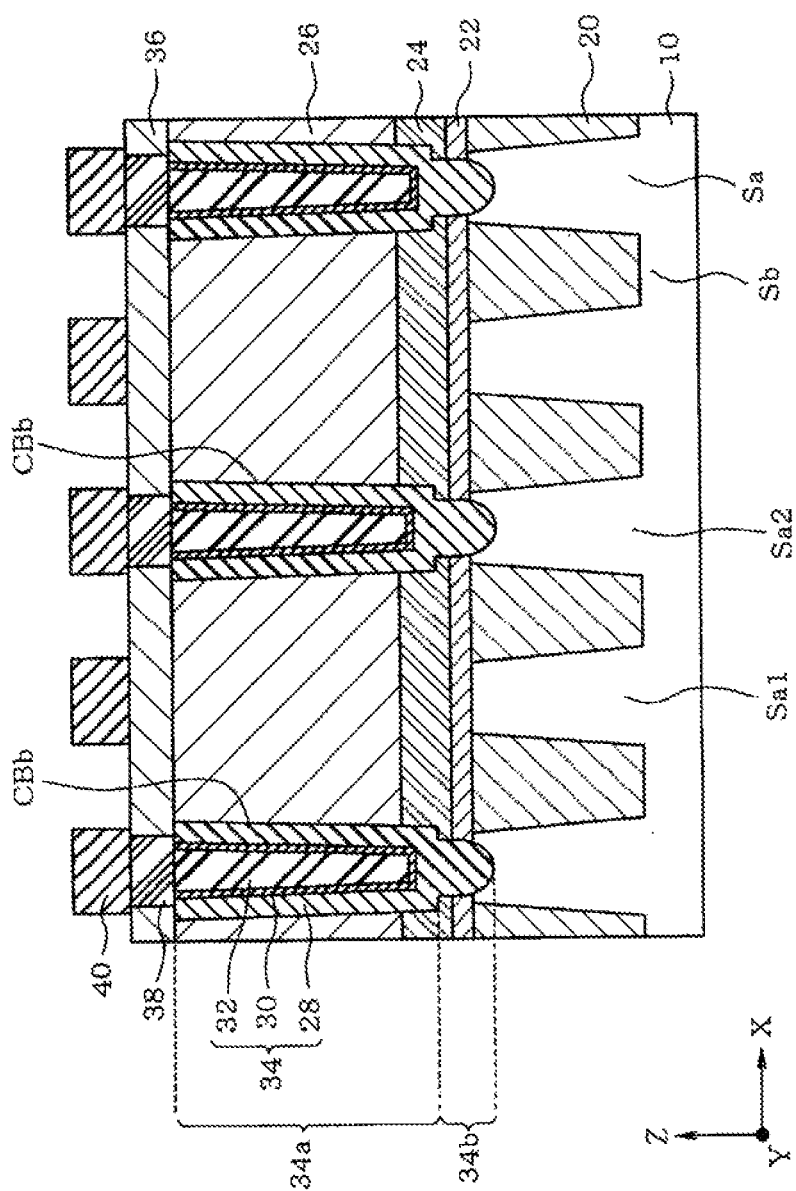
FIGS. 4 to 12 are examples of cross-sectional views in processes showing a structure and a manufacturing method according to a first embodiment and are examples of a longitudinal sectional view in a portion taken along line 4-4 of FIG. 3.

Next, a structure according to the first embodiment will be described with reference to FIG. 4. FIG. 4 is a cross-sectional view showing a structure according to this embodiment and shows an example of a longitudinal sectional view in a portion of the NAND memory 1 taken along line 4-4 of FIG. 3.

The element regions Sa and the element isolation areas Sb are alternately disposed in the X-direction in the semiconductor substrate 10. An element isolation insulating film 20 is formed in the element isolation area Sb. For example, a silicon substrate may be used as the semiconductor substrate 10. For example, a silicon oxide film may be used as the element isolation insulating film 20.

A first insulating film 22, a second insulating film 24, and a third insulating film 26 are formed on the semiconductor substrate 10. For example, a silicon substrate may be used as the semiconductor substrate 10. For example, a silicon oxide film may be used as the first insulating film 22 and the third insulating film 26. For example, a silicon nitride film may be used as the second insulating film 24.

The first contact plug 34 passes through the first, second and third insulating films 22, 24 and 26 and contacts the semiconductor substrate 10 at an element formation region Sa. The first contact plug 34 includes an outer first conductive film 28, an intermediate second conductive film 30, and an inner third conductive film 32. For example, titanium nitride (TiN) may be used as the first conductive film 28. In addition, a stacked film of titanium (Ti) and titanium nitride may be used as the first conductive film. The first conductive film 28 functions as a barrier metal for suppressing the formation of a silicide of the material of the third conductive film due to reaction between the third conductive film 32 and the semiconductor substrate 10 (silicon). It is possible to use a metal as the second conductive film 30 and the third conductive film 32 and to use, for example, tungsten as the metal. The second conductive film 30 and the third conductive film 32 may be different portions of one body, and a boundary therebetween may not be recognized in an actual device.

In addition, the first contact plug 34 includes the first not in the figures. The upper end of the first contact plug 34 in the Z-direction is the first portion 34a and the lower end thereof in the Z-direction is the second portion 34b. The width of the first portion 34a (minor axis of the first portion 34a which is an ellipse) is larger than the width of the second portion 34b (minor axis of the second portion 34b which is an ellipse). In addition, a step is present at the boundary between the first portion 34a and the second portion 34b. The step in the contact plug 34 is located in the second insulating film 24. Although not shown in the drawing, the same relationship is established also in the major axis direction of the first contact plug 34.

The second portion 34b is composed of the first conductive film 28, as the second conductive film 30 and the third conductive film 32 are not formed in the second portion. The first portion 34a is composed of a stacked film in which the first conductive film 28, the second conductive film 30, and the third conductive film. 32 are sequentially located from the exterior of the contact plug 34.

The bottom of the first contact plug 34 (bottom of the second portion 34b) extends into a recessed portion in the element formation region Sa, which is formed as a groove extending downwardly in the Z-direction from the surface of the element region Sa (semiconductor substrate 10), and thus extends into the element region Sa. For this reason, the contact area between the first contact plug 34 and the element region Sa is increased in comparison to a situation where a flat bottom of a contact plug is contacted against the element formation region Sa, and thus it is possible to reduce contact resistance between the contact plug 34 and the element formation region Sa (semiconductor substrate 10).

A fourth insulating film 36 is formed on the third insulating film 26. A second contact plug 38 extends through the fourth insulating film 36 to contact the first contact plug 34. Wirings 40 are formed on the fourth insulating film 36 and contact the top surface of the second contact plug 38. The wirings 40 extend in the Y-direction and are disposed in parallel so as to have a line-and-space configuration in the X-direction. The second contact plug 38 and the wiring 40 are formed of a metal film, and it is possible to use, for example, tungsten as the metal film. The wiring 40 is disposed in substantially the same layout as the element region Sa when seen in a plan view.

As described above, in the NAND-type flash memory device 1 according to the first embodiment, the first contact plug 34 configuring the bit line contact CB includes the first portion 34a and the second portion 34b. The first portion 34a is formed on the upper end in the Z-direction, and the second portion 34b is disposed on the lower end in the Z-direction. The width of the first portion 34a (minor axis of the first portion 34a which is an ellipse) is larger than the width of the second portion 34b (minor axis of the second portion 34b which is an ellipse). The second portion 34b is composed of the first conductive film 28, and the second conductive film 30 and the third conductive film 32 are not formed in the second portion. The first portion 34a is composed of a stacked film of the first conductive film 28, the second conductive film 30, and the third conductive film 32.

Based on the above-described structure, the bit line contact CB may achieve a contact having a small bottom diameter in the second portion 34b located at the lower side. Thus, it is possible to suppress the deterioration of a breakdown voltage between the adjacent bit line contacts CB. In addition, it is possible to achieve a contact having a large diameter in the first portion 34a located at the upper side. For this reason, the formation of voids in the bit line contact plug structure is suppressed, and thus it is possible to reduce the occurrence of an open failure.

(Manufacturing Method According to First Embodiment)

Next, a method of manufacturing the NAND-type flash memory device 1 according to the first embodiment will be described with reference to FIGS. 4 to 12. FIGS. 4 to 12 are diagrams showing the substrate during the manufacturing steps of the NAND-type flash memory device 1 according to the first embodiment and show an example of a longitudinal sectional view for each process.

Figure 5:
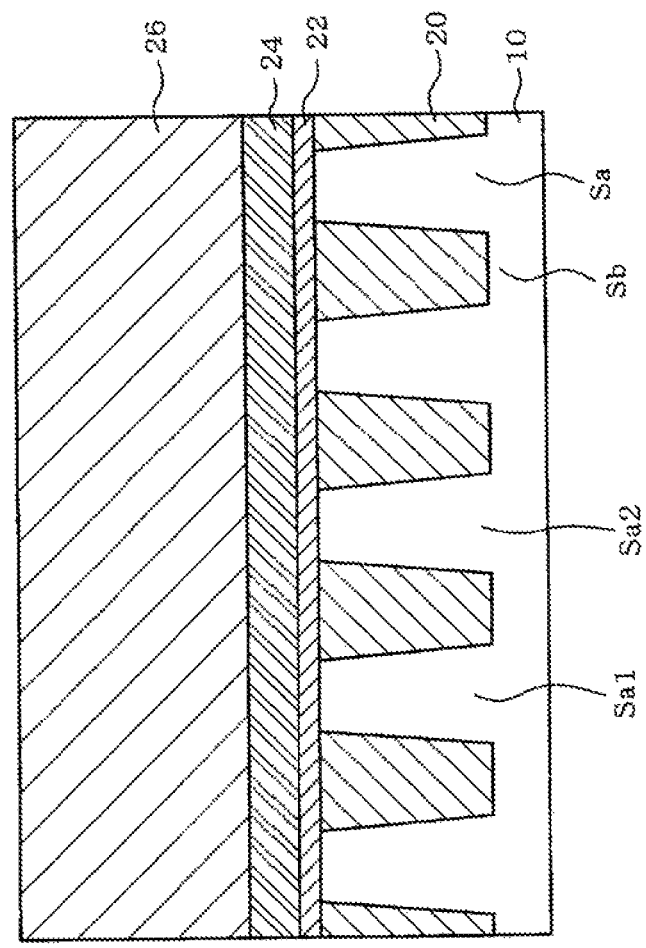

First, as shown in FIG. 5, the element isolation insulating film 20 is formed on the semiconductor substrate 10. The element isolation insulating film 20 may be formed by forming grooves in the semiconductor substrate 10 using a lithography method and a reactive ion etching (RIE) method and deposition the element isolation insulating film 20 in the groove. Subsequently, the first insulating film 22, the second insulating film 24, and the third insulating film 26 are sequentially formed on the semiconductor substrate 10 and the element isolation insulating film 20. For example, a silicon oxide film may be used as the first insulating film 22. The silicon oxide film may be formed using, for example, a chemical vapor deposition (CVD) method. For example, a silicon nitride film may be used as the second insulating film 24. The silicon nitride film may be formed using, for example, a CVD method. For example, the second insulating film 24 may be formed by being divided into two layers. For example, it is possible to form a first layer of the second insulating film 24, to introduce dopants to the surfaces of the semiconductor substrate 10 (element region Sa) and the element isolation insulating film 20 by using an ion implantation method, and to form a second layer of the second insulating film 24. For example, phosphorus (P) and arsenic (As) may be used as the dopants. For example, a silicon oxide film may be used as the third insulating film 26. The silicon oxide film may be formed using, for example, a CVD method.

Figure 6:
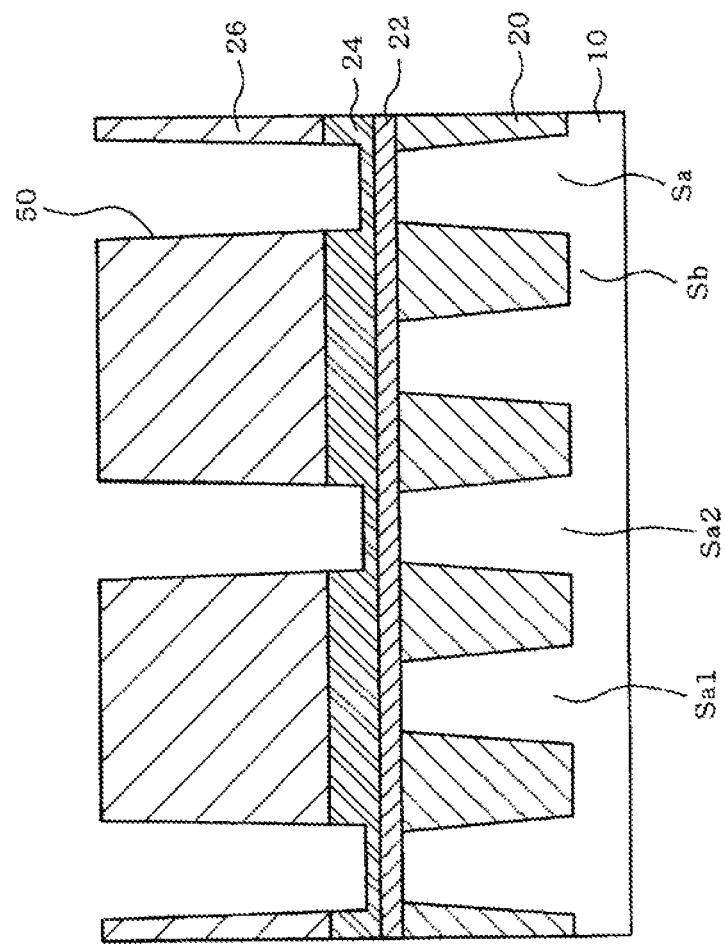

Next, as shown in FIG. 6, a contact hole 50 (bit line contact CB) is formed in the third insulating film 26 using a lithography method and an RIE method. When the third insulating film 26 is etched using the RIE method, over etching is applied. For this reason, the etching is performed up to the middle of the second insulating film 24, and thus the contact hole 50 is formed up to the middle of the second insulating film 24. As described above, since the bit line contacts CB are disposed to have a zigzag disposition when seen in a plan view, a long distance between the bit line contacts CB adjacent to each other is secured. Thus, it is possible to form a mask for forming a pattern of the contact hole 50 by using a lithography method.

Figure 7:
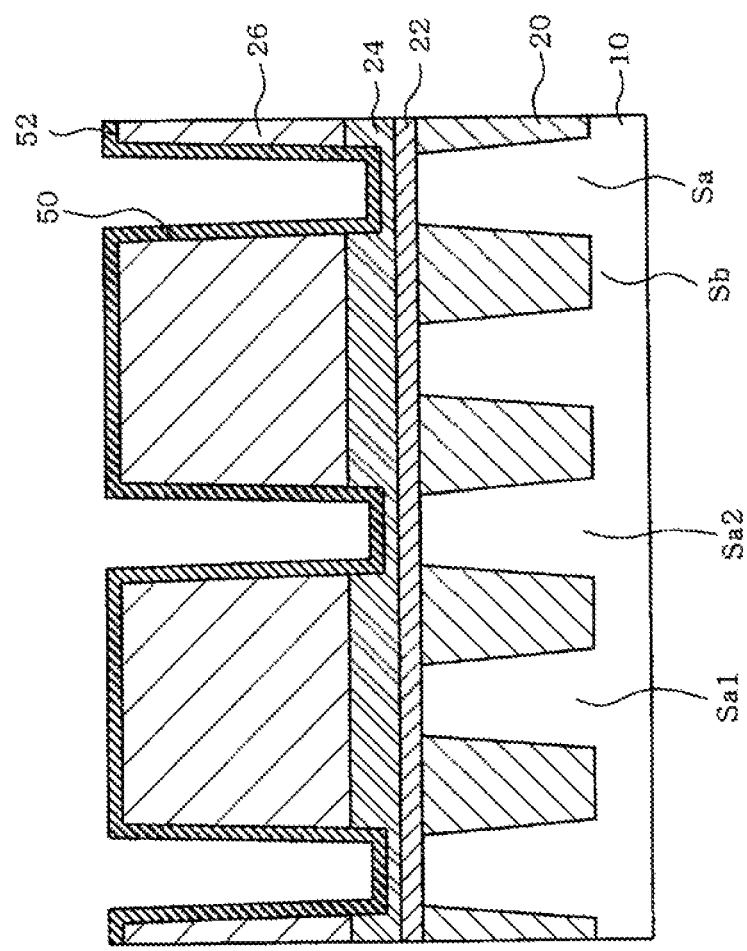

Next, as shown in FIG. 7, a spacer insulating film 52 is formed on the entire surface including the surfaces of the third insulating film 26 and the contact hole 50. For example, a silicon oxide film may be used as the spacer insulating film 52. The silicon oxide film may be formed using, for example, a CVD method. The spacer insulating film 52 is formed using conditions for forming the film conformally. For this reason, the spacer insulating film 52 is formed in conformity with the shape of the contact hole 50 formed in the third insulating film 26.

Figure 8:
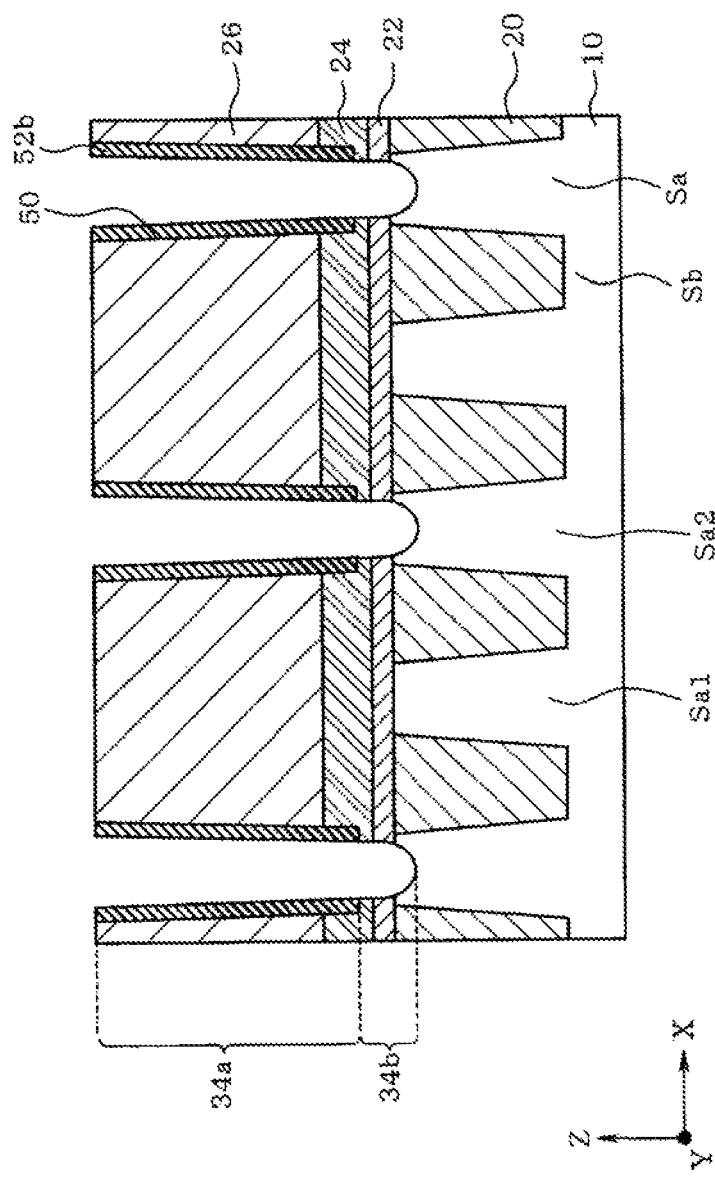

Next, as shown in FIG. 8, etching is performed on the entire surface using an RIE method based on anisotropic conditions. Thus, the spacer insulating film 52 remains in a vertical portion of the side surface of the contact hole 50, and a sidewall film 52b based on the spacer insulating film 52 is formed. Subsequently, etching is performed using an RIE method based on anisotropic conditions by using the third insulating film 26 and the sidewall film 52b as masks to etch the second insulating film 24 and the first insulating film 22. In this etching, over etching is applied, and a recessed portion (groove) having the pattern of the sidewall film 52b transferred thereto is formed in the element region Sa of the semiconductor substrate 10. The recessed portion is formed to have a diameter smaller than the diameter of the contact hole 50 by the film thickness of the sidewall film 52b, that is, the film thickness of the spacer insulating film 52. A contact area with the element region Sa (semiconductor substrate 10) increases in the bottom of the first contact plug 34 (bit line contact CB) to be formed later through the recessed portion, and thus contact resistance is reduced.

Figure 9:
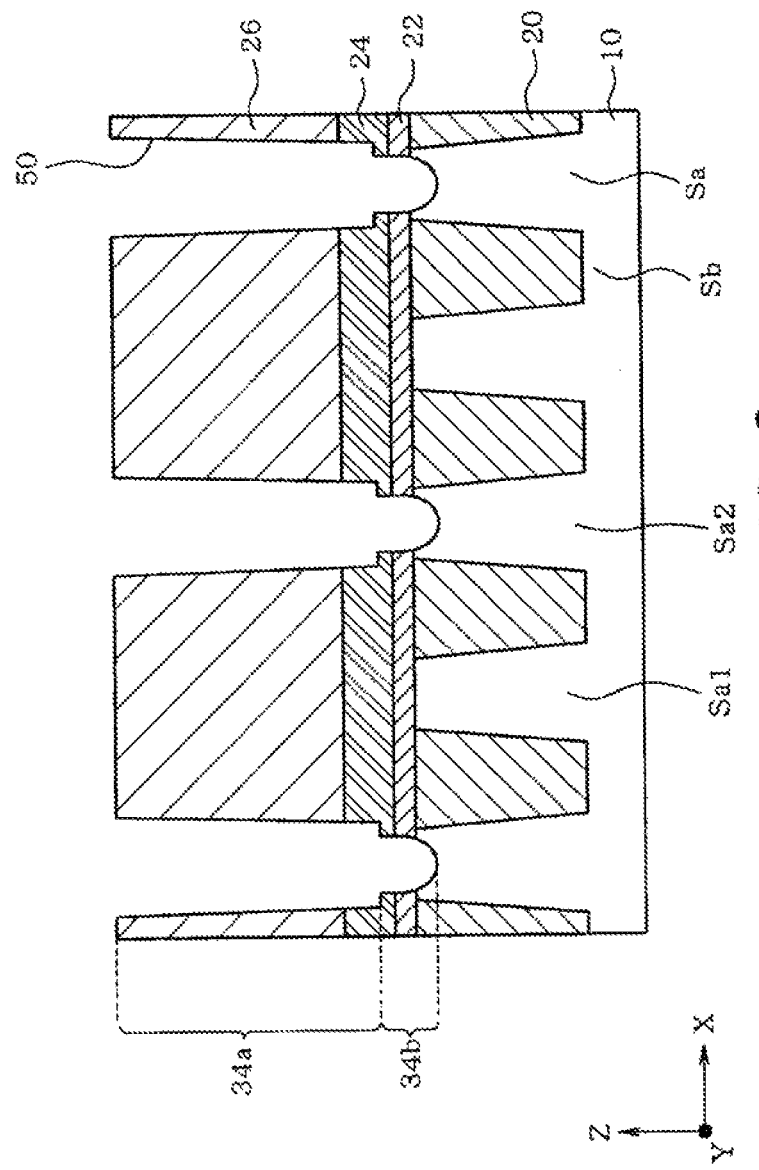

Next, as shown in FIG. 9, the sidewall film 52b is removed. The sidewall film 52b may be removed, for example, by wet etching using a diluted hydrofluoric acid solution. The first portion 34a having a large diameter and the second portion 34b having a small diameter are formed in the contact hole 50 through this process.

Meanwhile, the material of the spacer insulating film 52 (52b) is a silicon oxide film which is the same as those of the third insulating film 26 and the first insulating film 22, but the spacer insulating film 52 is formed so that the film material thereof becomes sparse. Accordingly, the spacer insulating film 52 has a higher etching rate based on the diluted hydrofluoric acid solution, and thus it is possible to selectively remove the sidewall film 52b.

Figure 10:
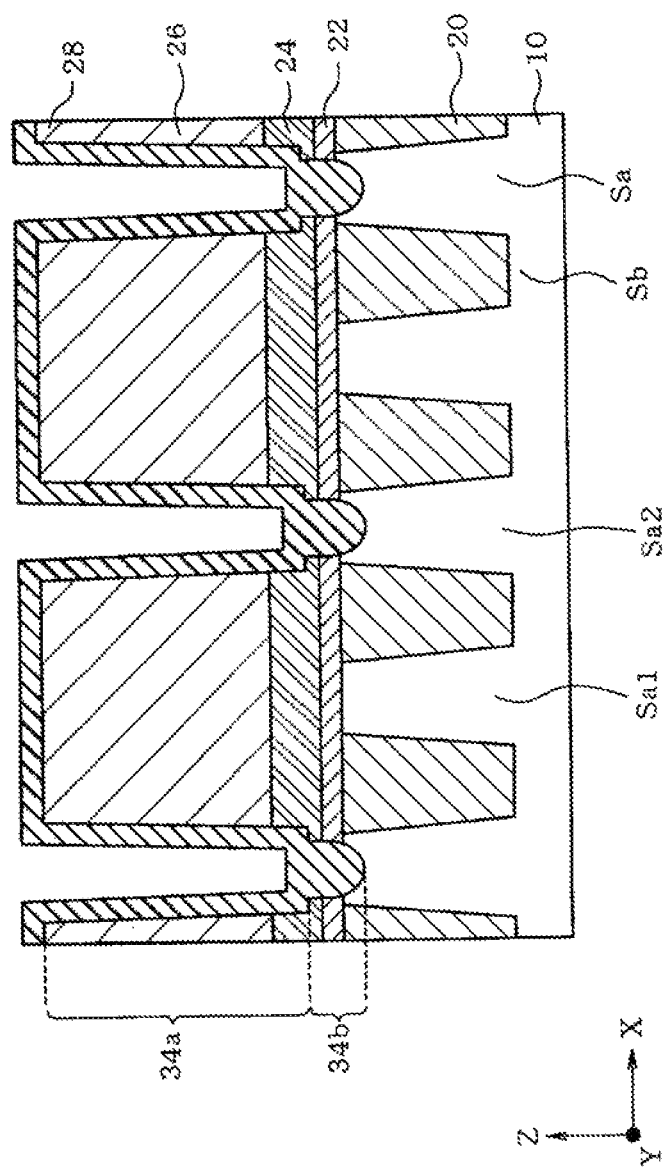

Next, as shown in FIG. 10, the first conductive film 28 is formed on the entire surface including the inside of the contact hole 50. For example, titanium nitride (TiN) may be used as the first conductive film 28. The titanium nitride may be formed under conditions for forming the film conformally by using, for example, a CVD method. In addition, a stacked film of titanium (Ti)/titanium nitride (TiN) may be used as the first conductive film 28. Titanium may be formed using, for example, a CVD method. Thus, the second portion 34b is filled with and buried by the first conductive film 28. It may also be said that the second portion 34b is blocked by the first conductive film 28. The first portion 34a is not filled with the first conductive film 28 and is configured such that the first conductive film 28 is formed on the side and bottom surfaces thereof and a space is formed in the center thereof.

Figure 11:
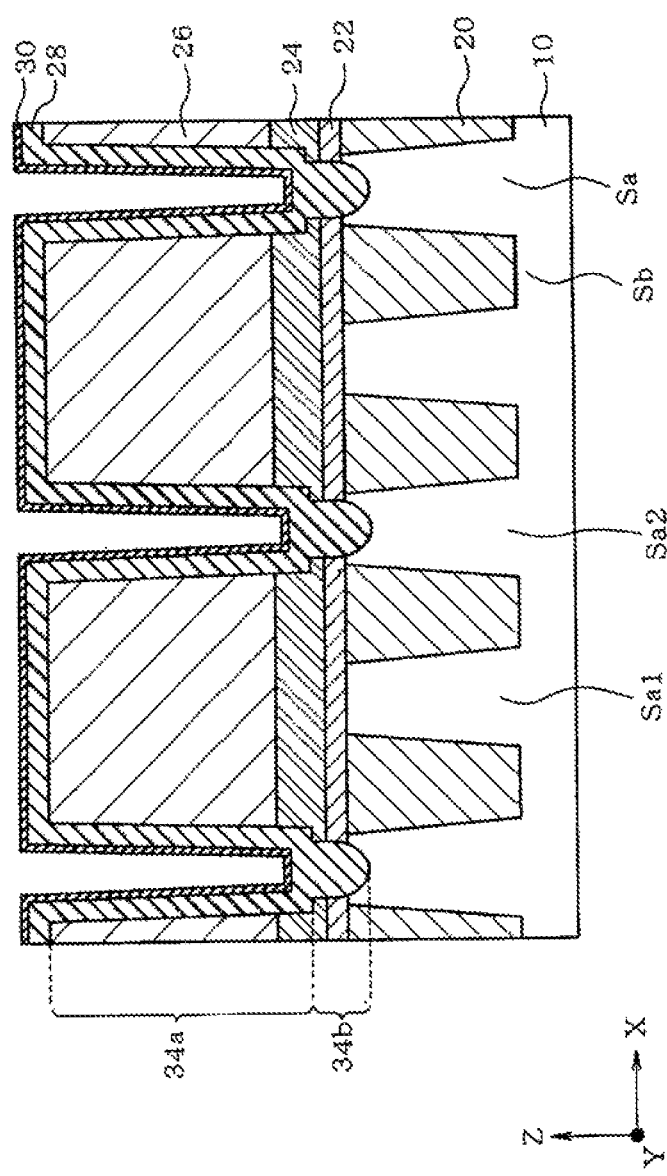

Next, as shown in FIG. 11, the second conductive film 30 is formed on the surface of the first conductive film 28. For example, tungsten (W) may be used as the second conductive film 30, and the second conductive film having an extremely small film thickness is formed using, for example, an atomic layer deposition (ALD) method. The second conductive film 30 is an initial film of the third conductive film 32 (tungsten) to be formed next, and functions as a seed layer for forming the third conductive film 32.

Figure 12:
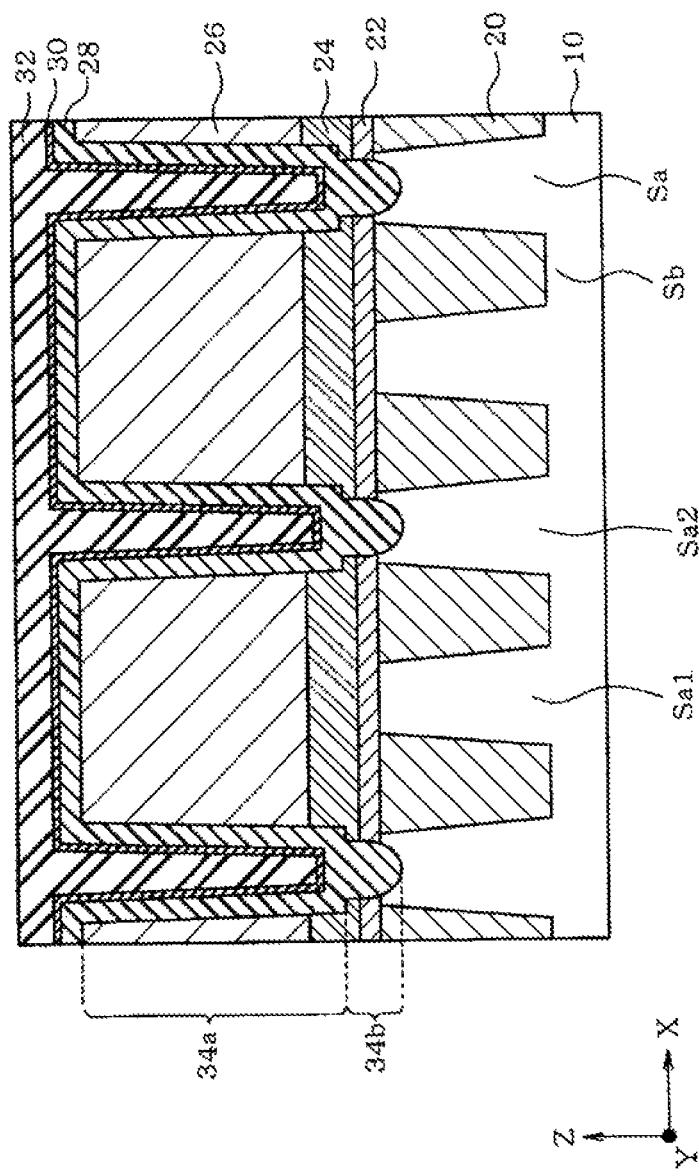

Next, as shown in FIG. 12, the third conductive film 32 is formed on the second conductive film 30. For example, tungsten may be used as the third conductive film 32. Tungsten may be formed using, for example, a CVD method. Thus, the first portion 34a which is located at an upper portion of the contact hole 50 is formed by the first conductive film 28, the second conductive film 30, and the third conductive film 32. Further, the first to third conductive films are also formed on the third insulating film 26. It may also be said that the first portion 34a is formed of the first conductive film 28, the second conductive film 30, and the third conductive film 32.

Next, as shown in FIG. 4, the first conductive film 28, the second conductive film 30, and the third conductive film 32 formed on the third insulating film 26 are polished and removed using a chemical mechanical polishing (CMP) method to thereby expose the top surface of the third insulating film 26. Thus, it is possible to form the first contact plug 34 filled with the first conductive film 28, the second conductive film 30, and the third conductive film 32 in the contact hole 50. Subsequently, the fourth insulating film 36 is formed, and the second contact plug 38 connected to the upper portion of the first contact plug 34 is formed. Then, the wirings 40 are formed so as to pass through and be connected to the top of the second contact plug 38. A silicon oxide film formed using, for example, a CVD method may be used as the fourth insulating film 36. Tungsten formed using, for example, a CVD method may be used as the second contact plug 38 and the wiring 40. The wiring 40 is a bit line BL and is formed so as to extend in the Y-direction. It is possible to form the NAND-type flash memory device 1 according to the first embodiment through the above-mentioned processes.

According to this embodiment, it is possible to reduce the diameter of the contact in the second portion 34b which is a lower portion of the first contact plug 34. Thus, it is possible to suppress a short circuit between the element regions Sa (active areas) adjacent to each other and to suppress the deterioration of a breakdown voltage.

In addition, it is possible to increase the diameter of the contact in the first portion 34a which is the upper portion of the first contact plug 34. Thus, it is possible to suppress the occurrence of an open failure due to the formation of a void caused by defective filling of tungsten formed within the contact hole 50.

According, since the first contact plug 34 may be formed without reducing the thickness of the first conductive film 28, it is possible to exhibit a sufficient barrier effect on the formation of tungsten of the first conductive film 28 and to suppress the occurrence of a contact leakage.

In addition, since the first contact plug 34 may be formed without reducing the thickness of the second conductive film 30 serving as a seed layer for forming tungsten, it is possible to suppress the generation of a void due to a film formation failure of the third conductive film 32.

Therefore, it is possible to provide a semiconductor device with high reliability by using this embodiment.

Second Embodiment

Next, a second embodiment in which a NAND-type flash memory device is applied as a semiconductor device will be described with reference to FIGS. 13 and 14. In the following description, matters in common with those in the first embodiment use the drawings used in the first embodiment, and a description thereof will be appropriately omitted. In addition, components having the same function and configuration as those in the first embodiment will be denoted by the same reference numerals and signs, and a description thereof will be appropriately omitted.

An equivalent circuit of a memory cell array and a layout pattern of a memory cell region M of a NAND-type flash memory device 1 according to a second embodiment have the same configurations as those shown in FIGS. 1 to 3 described in the first embodiment. The NAND-type flash memory device 1 according to the second embodiment has a cross-sectional structure different from that in the first embodiment.

Figure 13:
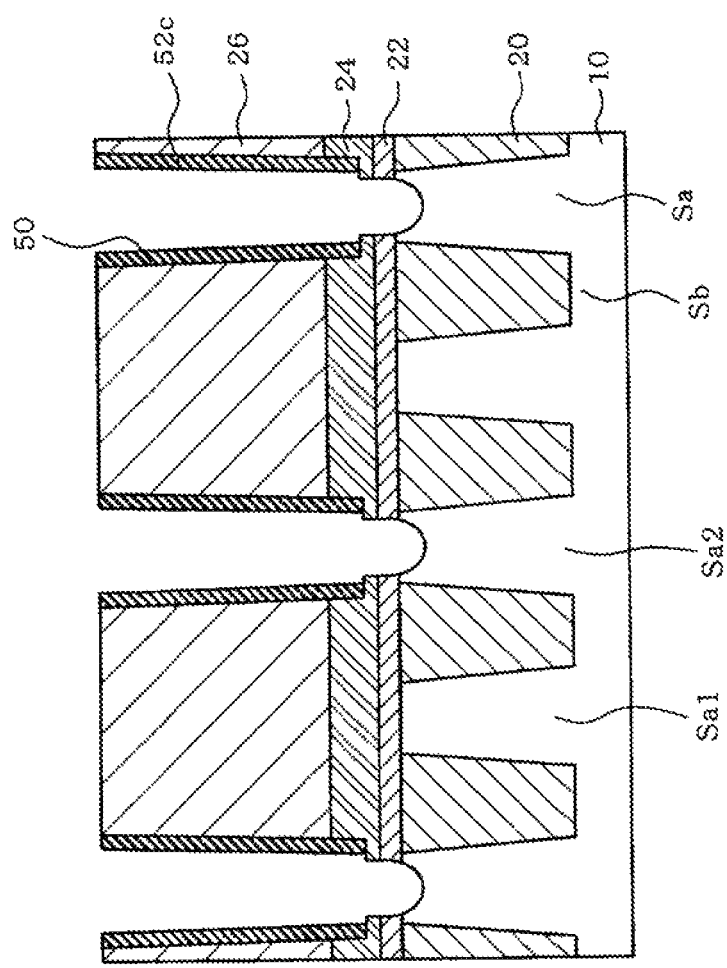
FIG. 13 is an example of a longitudinal sectional view showing a halfway state of a process of manufacturing a NAND-type flash memory device according to a second embodiment.

FIG. 13 shows an example of a longitudinal sectional view showing a halfway state of a process of manufacturing the NAND-type flash memory device 1 according to the second embodiment. The structure shown in FIG. 13 is equivalent to the structure shown in FIG. 9 according to the first embodiment. That is, FIG. 13 shows a state after a wet etching process using diluted hydrofluoric acid is performed. In this embodiment, a sidewall film 52c having a smaller film thickness than that of the sidewall film 52b is formed by wet etching of the sidewall film 52b without removing the entire sidewall film 52b. The film thickness of the sidewall film 52c is adjusted by the concentration, a processing time, and the like of wet etching using diluted hydrofluoric acid. Thus, a contact hole having a shrunk contact diameter is formed by the contact hole 50 and the sidewall film 52c. That is, it is possible to control the size of an upper portion of the diameter of the contact hole, which is finally formed, by adjusting the film thickness of the sidewall film 52c left when wet etching using a diluted hydrofluoric acid solution. Accordingly, it is possible to control the diameter of a first portion 34a which is an upper portion of a first contact plug 34 to be formed later.

Figure 14:
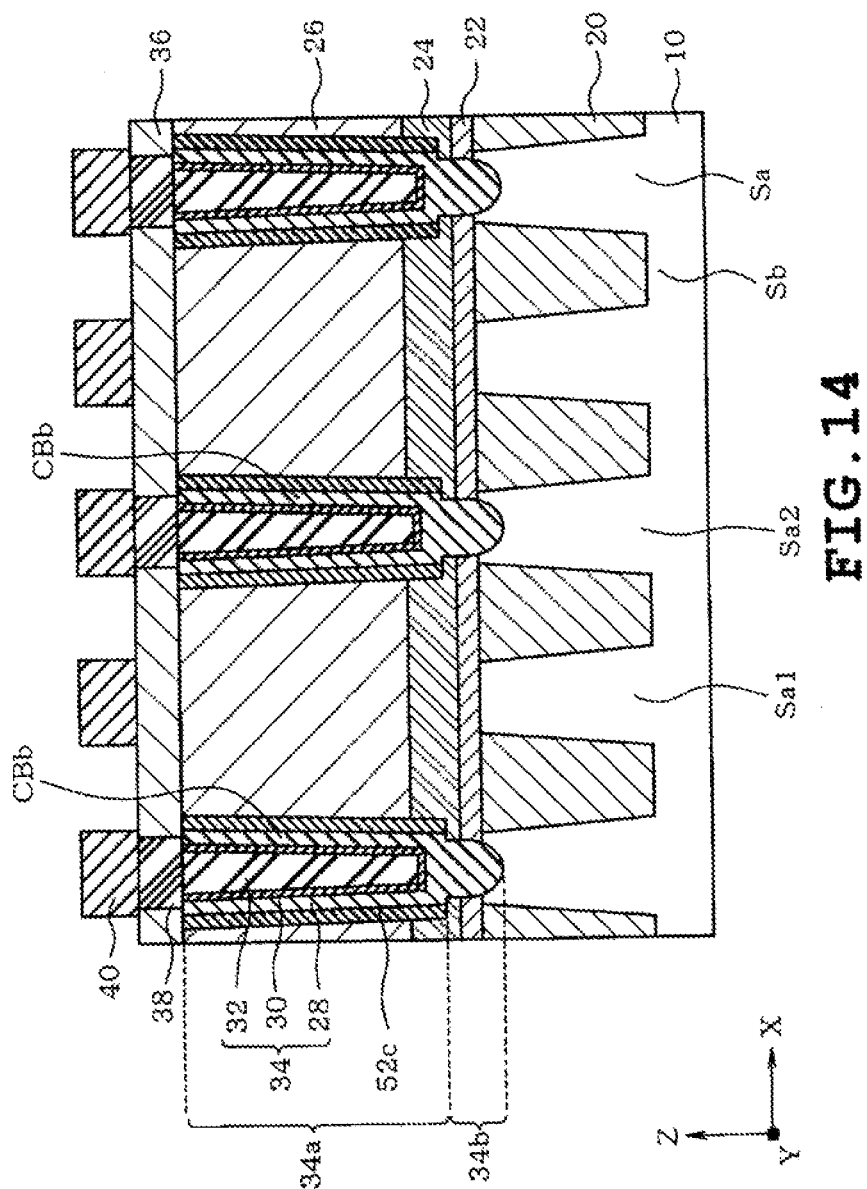
FIG. 14 is an example of a longitudinal sectional view showing the structure of the NAND-type flash memory device according to the second embodiment.
Figure 15:
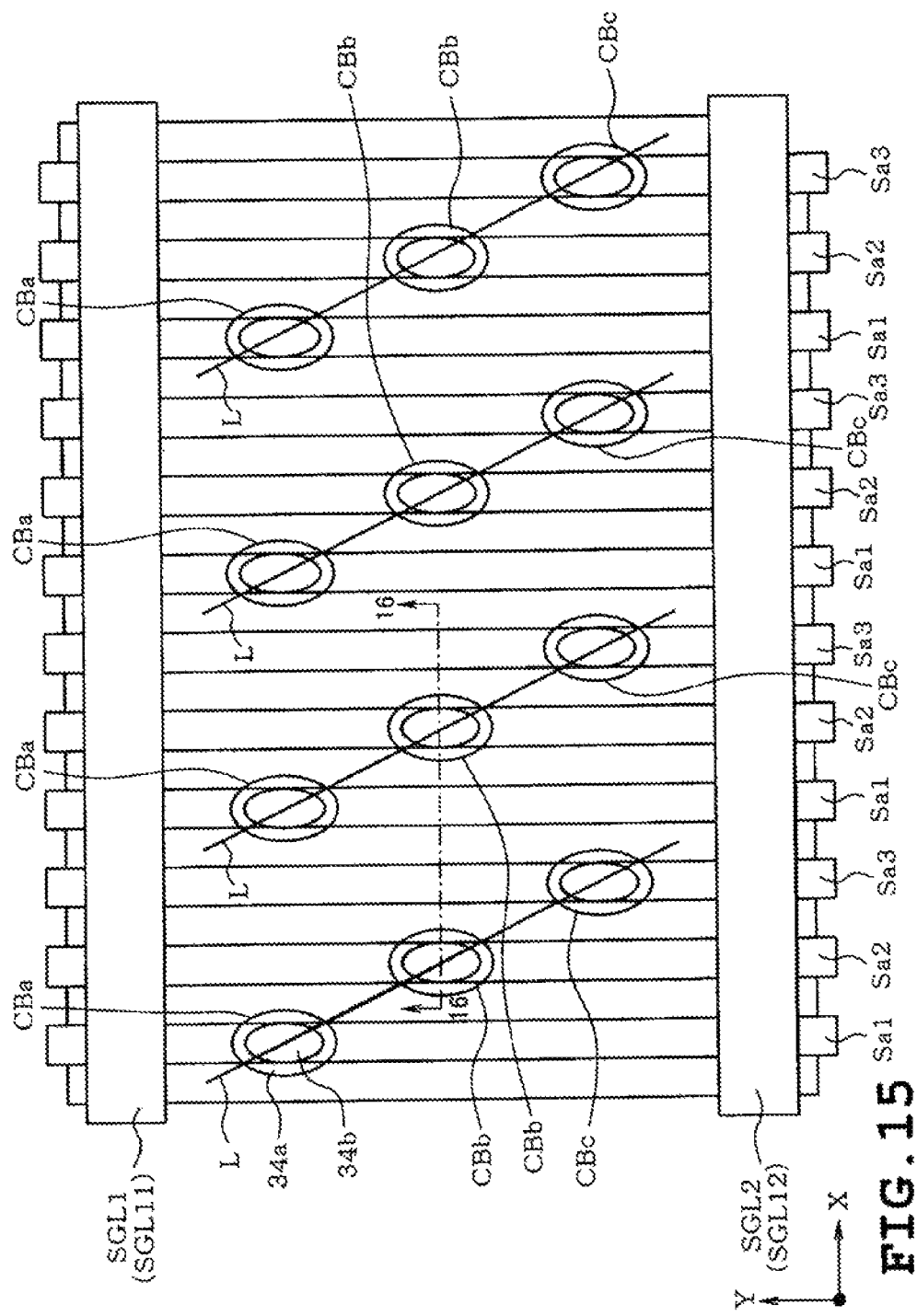
FIG. 15 is an example of an enlarged plan view of a bit line contact region according to a third embodiment and selection gate electrodes adjacent to the bit line contact region.

FIG. 14 is an example of a longitudinal sectional view showing the structure of the NAND-type flash memory device 1 according to the second embodiment, and is an example of a longitudinal sectional view of a portion taken along line 16-16 of FIG. 15. The structure shown in FIG. 14 is equivalent to the structure shown in FIG. 4 according to the first embodiment. As shown in FIG. 14, the first contact plug 34 includes the first portion 34a which is an upper portion and a second portion 34b which is a lower portion. The second portion 34b is buried by a first conductive film 28. The first portion 34a includes a sidewall film 52c on the side wall thereof and is buried by the first conductive film 28, a second conductive film 30, and a third conductive film 32. Similarly to the first embodiment, a fourth insulating film 36, a second contact plug 38, and wirings 40 (bit line BL) are formed thereon.

According to the second embodiment, the same effects as in the first embodiment are obtained. In addition, according to the second embodiment, it is possible to control the size of the diameter of the first portion 34a which is an upper portion of the first contact plug 34 by adjusting the film thickness of the sidewall film 52c. Accordingly, it is possible to make the diameter of the first portion 34a have an appropriate size in association with the finished dimension of the contact hole 50 and the selection of the film thicknesses of the first conductive film 28, the second conductive film 30, and the third conductive film 32.

Third Embodiment

Next, a third embodiment in which a NAND-type flash memory device is applied as a semiconductor device will be described with reference to FIGS. 15 and 16. In the following description, features in common with those in the first embodiment use the drawings used in the first embodiment, and a description thereof will be appropriately omitted. In addition, components having the same function and configuration as those in the first embodiment will be denoted by the same reference numerals and signs, and a description thereof will be appropriately omitted.

An equivalent circuit of a memory cell array of a NAND-type flash memory device 1 according to the third embodiment has the same configuration as that shown in FIG. 1 described in the first embodiment. In the NAND-type flash memory device 1 according to the third embodiment, a layout pattern of a bit line contact CB is different from that in the first embodiment.

As shown in FIG. 15, a bit line contact CBa formed on a first element region Sa1 in the X-direction in the drawing is configured such that the position thereof in the Y-direction is disposed in proximity to a selection gate line SGL11 (selection gate electrode SGD) side of a block Bk. A bit line contact CBc formed on a third element region Sa3 in the X-direction is configured such that the position thereof in the Y-direction is disposed in proximity to a selection gate line SGL12 (selection gate electrode SGD) side of a block Bk+1. A bit line contact CBb formed on a second element region Sa2 in the X-direction is configured such that the position thereof in the Y-direction is disposed in the center between the bit line contacts CBa and CBc. The bit line contacts CBa, CBb, and CBc are present on a straight line L which is not parallel to the X-direction and the Y-direction in a direction parallel to a semiconductor substrate 10. That is, three of the bit line contacts CBa, CBb, and CBc successively formed are disposed on element regions Sa1, Sa2, and Sa3 successively formed so as to be mounted on the straight line L. The three bit line contacts are set as one unit, and this unit is repeatedly disposed in the X-direction. That is, the bit line contacts CBa, CBb, and CBc are disposed to have a so-called three-successive zigzag disposition.

As described above, in the third embodiment, the bit line contacts CBa, CBb, and CBc are disposed in a zigzag shape (a so-called three-successive zigzag disposition in which three-successive contacts are set as a repetition unit of a zigzag structure) in which the positions of the bit line contacts are sequentially shifted in the Y-direction on three element regions Sa (Sa1, Sa2, and Sa3) which are successively adjacent to each other, when seen in a plan view (when seen in a top view). Accordingly, a distance in the Y-direction between the bit line contacts CB (between CBa and CBb) becomes longer, and thus it is possible to further increase the distance between the bit line contacts CB adjacent to each other.

Figure 16:
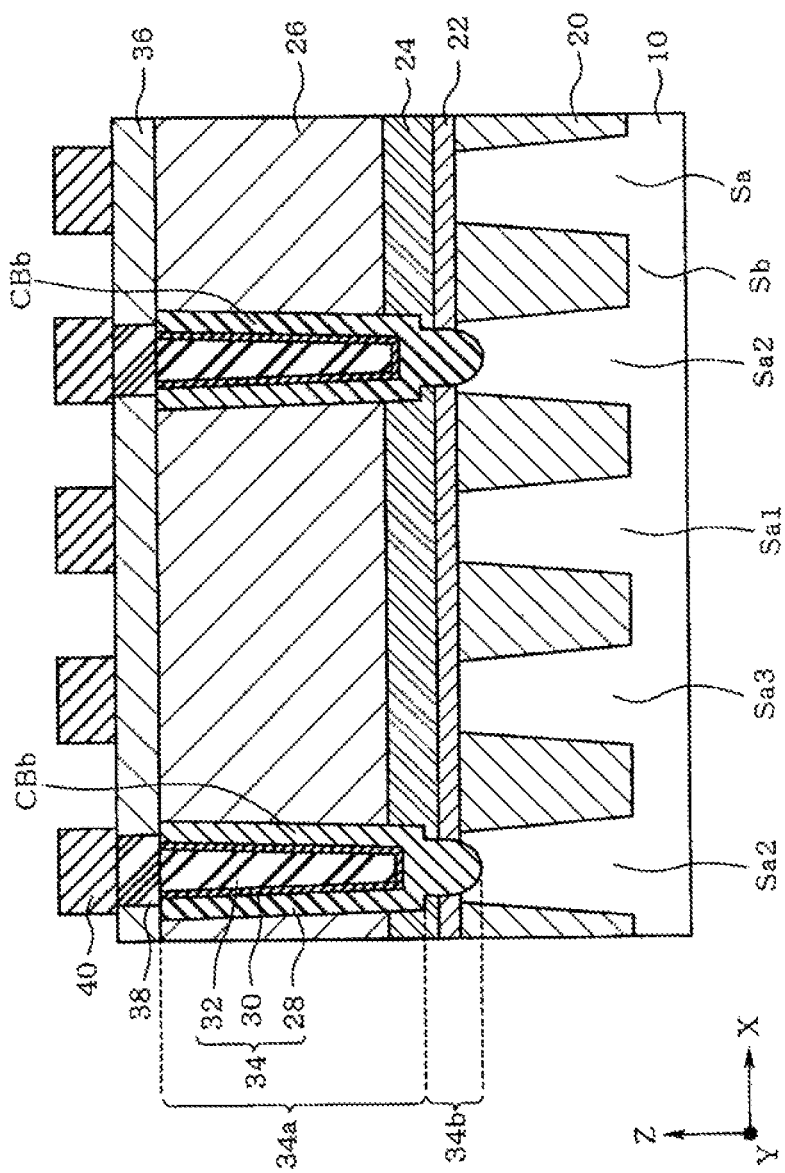
FIG. 16 is an example of a longitudinal sectional view showing the structure of a NAND-type flash memory device according to the third embodiment, and is an example of a longitudinal sectional view in a portion taken along line 16-16 of FIG. 15.

FIG. 16 shows the cross-sectional structure of the NAND-type flash memory device 1 according to the third embodiment. FIG. 16 shows a longitudinal sectional structure of a portion taken along line 16-16 in FIG. 15. That is, the longitudinal sectional structure of the bit line contact CBb is shown. As shown in FIG. 16, the first contact plug 34, that is, the bit line contact CBb is formed on the element region Sa2 among the element regions Sa1, Sa2, and Sa3 which are successively disposed. In the drawing, the bit line contacts CBa and CBc are located on the front side and the back side in the Y-direction, and thus are not shown in the cross-sectional view. The other configurations are the same as those shown in FIG. 4.

As described above, according to the NAND-type flash memory device 1 according to the third embodiment the same effects as those in the first embodiment may be exhibited. In addition, according to the third embodiment, the bit line contacts CB successively disposed are formed to have a three-successive zigzag disposition, and thus a distance between the bit line contacts CB adjacent to each other is increased. Accordingly, it is possible to more remarkably obtain effects of suppressing a short circuit between the bit line contacts CB adjacent to each other, that is, between the element regions Sa (active areas) adjacent to each other and suppressing the deterioration of a breakdown voltage.

Other Embodiments

As described above, a two-successive staggering disposition is illustrated and described in the first and second embodiments and a three-successive zigzag disposition is illustrated and described in the third embodiment. However, this is just an example, and any N-successive zigzag disposition (N is a fixed integer of 2 or greater) such as a four-successive zigzag disposition and a five-successive zigzag disposition may be used.

In the above-described embodiments, a description is given on the assumption that the bit line contact CB has an elliptical shape when seen in a plan view, but the exemplary embodiment is not limited thereto. For example, the bit line contact may have substantially a perfect circle shape.

In the above-described embodiments, a case is described in which the bit line contacts CB are successively formed on the element regions Sa, having a line-and-space shape, which are disposed to have a minimum pitch and a minimum dimension, but the exemplary embodiment is not limited thereto. The effects of this embodiment may be obtained in a situation where a contact is formed on a narrow pattern. Accordingly, the above-described embodiment may be applied to, for example, a contact which is formed independently without being formed successively. In addition, a region to which a contact is connected is not limited to an element region and may be a wiring or the like.

In the above-described embodiments, an example in which a NAND-type flash memory device is used is described, but a NOR-type flash memory device, a non-volatile semiconductor memory device such as an EPROM, a semiconductor memory device such as a DRAM or an SRAM, or a logic semiconductor device such as a microcomputer may be used.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate;
a plurality of element regions that are positioned in a line-and-space shape and extend in a first direction in the substrate;
a plurality of selection gates that are formed on the substrate to extend in a second direction intersecting the first direction; and
a contact region that includes a plurality of contact plugs which are provided between two selection gates adjacent to each other and connected to the respective element regions in the substrate,
wherein the contact plug includes an upper portion and a lower portion, the upper portion having a first width and being buried by a stacked film including a first conductive film and a second conductive film and the lower portion having a second width smaller than the first width and being buried by the first conductive film.

2. The semiconductor device according to claim 1, wherein in the upper portion of the contact plug, the first conductive film is located around the second conductive film.

3. The semiconductor device according to claim 1, further comprising:
a plurality of memory cells; and
a plurality of memory blocks each of which includes the plurality of memory cells and the plurality of selection gates,
wherein two selection gates adjacent to each other are included in the memory blocks adjacent to each other.

4. The semiconductor device according to claim 1, wherein the contact plug has a step in a boundary between the upper portion and the lower portion.

5. The semiconductor device according to claim 4, wherein the step of the contact plug is positioned higher than a surface of the substrate.

6. The semiconductor device according to claim 4, wherein a silicon oxide film is formed on the substrate,
a silicon nitride film is formed on the silicon oxide film, and the step of the contact plug is positioned within the silicon nitride film.

7. The semiconductor device according to claim 1, wherein the second conductive film is a two-layered conductive film.

8. The semiconductor device according to claim 1, wherein a recessed portion is formed in the substrate positioned directly below the contact plug.

9. The semiconductor device according to claim 1, wherein the first conductive film contains titanium nitride, and
the second conductive film contains tungsten.

10. A semiconductor device comprising:
a substrate;
a plurality of element regions that are partitioned in a line-and-space shape and extend in a first direction in the substrate;
a plurality of selection gates that are formed on the substrate to extend in a second direction intersecting the first direction; and
a contact region that includes a plurality of contact plugs which are provided between two selection gates adjacent to each other and connected to the respective element regions in the substrate,
wherein the contact region includes a plurality of units in which N contact plugs, where N is an integer of 2 or greater, are formed on N adjacent element regions, wherein each plurality of units are spaced along a straight line intersecting the first direction and the second direction, and
wherein the contact plug includes an upper portion and a lower portion, the upper portion having a first width and being buried by a stacked film including a first conductive film and a second conductive film and the lower portion having a second width smaller than the first width and being buried by the first conductive film.

11. The semiconductor device according to claim 10, wherein
the contact plug further comprises a step at the boundary between the upper portion and the lower portion thereof.

12. The semiconductor device according to claim 11, wherein the step of the contact plug is positioned higher than a surface of the substrate.

13. The semiconductor device according to claim 11, wherein
a silicon oxide film is formed on the substrate,
a silicon nitride film is formed on the silicon oxide film, and
the step of the contact plug is positioned within the silicon nitride film.

14. The semiconductor device according to claim 10, wherein
the second conductive film is a two-layered conductive film.

15. The semiconductor device according to claim 10, wherein
a recessed portion is formed in the substrate positioned directly below the contact plug.

16. The semiconductor device according to claim 10, wherein
the first conductive film contains titanium nitride, and
the second conductive film contains tungsten.

17. A semiconductor device comprising:
a plurality of conductive regions which are arranged in a line-and-space shape and extend in a first direction; and
a contact region that includes a plurality of contact plugs which are connected to the respective conductive regions,
wherein the contact plug includes an upper portion and a lower portion, the upper portion having a first width and being buried by a stacked film including a first conductive film and a second conductive film and the lower portion having a second width smaller than the first width and being buried by the first conductive film.

18. The semiconductor device according to claim 17, wherein
the contact plug has a step in a boundary between the upper portion and the lower portion.

19. The semiconductor device according to claim 18, wherein
the step of the contact plug is positioned higher than a surface of the conductive region.

20. The semiconductor device according to claim 18, wherein
a silicon oxide film is formed on the conductive region,
a silicon nitride film is formed on the silicon oxide film, and
the step of the contact plug is positioned within the silicon nitride film.

* * * * *